United States Patent

Jones et al.

[11] Patent Number: 5,818,574
[45] Date of Patent: Oct. 6, 1998

[54] METHOD AND APPARATUS FOR VEHICLE WHEEL ALIGNMENT TESTING

[75] Inventors: Barbara L. Jones; Stephen J. Davis, both of King's Lynn, United Kingdom

[73] Assignee: Sun Electric U.K. Limited, King's Lynn, England

[21] Appl. No.: 718,784

[22] Filed: Sep. 24, 1996

[30] Foreign Application Priority Data

Sep. 5, 1995 [GB] United Kingdom ............. 9518075

[51] Int. Cl.⁶ .................................. G01B 5/255
[52] U.S. Cl. ................. 356/139.09; 33/203.16
[58] Field of Search .................. 33/203.16, 203.19; 356/139.09

[56] References Cited

U.S. PATENT DOCUMENTS

| | | |
|---|---|---|
| 4,863,266 | 9/1989 | Masuko et al. . |
| 4,898,462 | 2/1990 | Thorne et al. ............... 33/203.19 |
| 4,899,218 | 2/1990 | Waldecker et al. . |
| 4,901,442 | 2/1990 | Fujii . |
| 4,918,821 | 4/1990 | Bjork . |
| 5,054,918 | 10/1991 | Downing et al. . |
| 5,074,048 | 12/1991 | Yokomizo et al. . |
| 5,105,546 | 4/1992 | Weise et al. . |
| 5,105,547 | 4/1992 | Fujii . |
| 5,111,585 | 5/1992 | Kawashima et al. . |
| 5,268,731 | 12/1993 | Fuchiwaki et al. . |
| 5,274,433 | 12/1993 | Madey et al. . |
| 5,443,537 | 8/1995 | Haskins . |
| 5,489,983 | 2/1996 | McClenahan et al. ............ 356/139.09 |
| 5,532,816 | 7/1996 | Spann et al. ......................... 33/203.19 |
| 5,600,435 | 2/1997 | Bartko et al. ........................ 33/203.16 |

*Primary Examiner*—Ronald L. Biegel
*Attorney, Agent, or Firm*—Emrich & Dithmar

[57] ABSTRACT

Method and apparatus for non-contact evaluation of wheel alignment for vehicles utilizes laser-based range-finders mounted at locations between which the vehicle is driven for test purposes. Range-finding at three locations on the wheel enables wheel attitude to be determined. Locations are chosen so that range-finding is carried out where a significant contour in the wheel assembly occurs, thereby enabling a clear and characteristic signal to be obtained from relatively simple apparatus.

18 Claims, 5 Drawing Sheets

METHOD AND APPARATUS FOR VEHICLE WHEEL ALIGNMENT TESTING

BACKGROUND OF THE INVENTION

1. Field of the Invention

This invention relates to a method and apparatus for vehicle wheel alignment testing.

2. Description of the Prior Art

There is disclosed in U.S. Pat. No. 4,899,218 (Waldecker et al.) a method and apparatus for vehicle wheel alignment testing providing a non-contact system which eliminates many of the drawbacks of previous systems by avoiding attachment of cumbersome apparatus, rapidity of operation, simplicity of use etc. However, the apparatus and method disclosed in the Waldecker specification is itself subject to certain significant limitations, principally ones relating to its general approach to the identification of the alignment of the plane in which the wheel lies.

In the Waldecker specification, there is employed a laser source for projecting a plane of light onto the wheel, tire or other integral part of the wheel, together with a solid-state television camera located to produce image signals representing the light pattern or contour on the surface of the wheel or tire, as viewed from the particular angle at which the camera is located. The data thus obtained is computer-processed to determine the rotational plane of the wheel. In the preferred embodiment, two radially equivalent points are identified on the surface of the tire corresponding to the points closest to the sensor modules, i.e., the crown of the tire sidewall, and are adopted as the points to be used for identification of the plane of the wheel. A special algorithm is employed to eliminate the effects of raised or embossed lettering on the tire sidewall.

We have discovered that, while the system disclosed in the Waldecker specification has undoubted advantages in terms of its comparison with previous contact-type systems, it is itself subject to the shortcoming that it requires the use of relatively expensive and sophisticated optical equipment in order to obtain adequately accurate results. We have further discovered that this limitation arises from the fact that the determinations of wheel attitude in the Waldecker system are made by reference to the particular portions of the wheel/tire assembly indicated above. It is particularly noteworthy that the Waldecker system actually includes, as a software feature, an algorithm intended to eliminate the effect of contour changes arising from such features as embossed lettering, whereby the intention is to take a reading from a surface which has the absolute minimum of contour variation, at least in the circumferential direction. This general approach is the opposite of that upon which the present invention is based.

There is disclosed in U.S. Pat. No. 5,054,918 a structured light scanning system applicable to automotive servicing. There is shown in FIG. 2 a system for wheel balancing or alignment in which a "stripe" of light exhibits a characteristic "bump" or discontinuity as it extends over the edge of the tire rim 19. The system measures quantities affecting automotive performance, such as tire/rim assembly balance, runout and alignment or break surface planarity and smoothness. There is no teaching or suggestion of directing beams to spaced-apart locations on the wheel rim, and neither is there any explanation of how the system could be used to determine wheel alignment.

U.S. Pat. No. 4,663,266 and U.S. Pat. No. 5,268,731 disclose laser-based wheel alignment systems having some technical similarities to that of the above-discussed Waldecker method. Other prior proposals relate to other types of wheel alignment systems utilizing laser or other light sources, but these all require contact with the wheel being measured.

SUMMARY OF THE INVENTION

We have found that if the method and apparatus are adapted so that, instead of basing the measurement upon the laser signal obtained from reflection of the beam from the tire sidewall surfaces, a location is chosen for the determination at which a significant change in contour occurs within a relatively short radial distance, there is produced a signal which is very significantly clearer and easier to read, so that relatively unsophisticated equipment can be employed at a much lower cost and with potentially greater accuracy.

For example, if the profile determination is made at the location where the edge of the wheel rim meets the sidewall of the tire, there is a relatively substantial contour change between the rounded edge of the metal wheel rim and the tire sidewall contained within it, and this leads to a very clear signal in terms of measured distance from the laser sensor apparatus, thereby giving a measure of the contour scrutinised.

Other locations on the tire itself are considered unlikely to be suitable since the next immediately radially outward portion of the tire is the sidewall, which, as discussed above, is subject to the limitations arising in the Waldecker system. And as for the tire tread region, this is itself subject to wear variations so substantial as to render it completely unsuitable as a basis for any reliable measurement. This comment applies almost equally to the tire sidewall itself and is another reason why the Waldecker system is considered relatively unsatisfactory.

By selecting a location for wheel plane determination at which a substantial contour variation occurs, the sensitivity and accuracy problems of the prior art are largely overcome. A minimum of three readings is needed in order to obtain a determination of the wheel plane sufficient for toe-in and camber angle and castor angle evaluation.

According to the invention there is provided a method and apparatus for vehicle wheel alignment testing as defined in the accompanying claims.

In the embodiments there is provided a non-contact method and apparatus for vehicle wheel alignment testing in which two or more laser sources direct beams of light to circumferentially spaced-apart locations along the junction between the wheel rim and tire, to produce a clear and easily read return signal which is processed by associated circuitry to give an indication of toe-in and camber and caster angles by the differences in distance measured by the sensors. Each laser sensor is radially adjustable on a frame and the frame is adjustable along horizontal and vertical axes for centering relative to the associated wheel being measured, with the aid of a locating light beam.

By effecting range-finding steps at the defined locations where significant range-affecting contour changes occur, the advantage is provided of improved ease of interpretation of the data obtained by the method and corresponding simplification of the apparatus accordingly.

In one embodiment the method uses a laser spot which is scanned across the relevant contoured portion of the wheel assembly. In another embodiment, an extended laser beam is employed whereby the need to scan the beam is avoided.

It is noted that while the wheel rim/tire intersection region is considered the preferred location for wheel plane determination using the contour variation feature of the present invention, it may also be possible to utilize a portion of the wheel rim located at least slightly inwardly of the outer edge of the rim, in a similar manner. Portions located significantly further inwards on the wheel are likely to lead to results of less accuracy due to the obvious geometric implications of taking measurements relatively close to the wheel center. The wheel nuts themselves are of course not always reliably all tightened to the same torque and therefore do not themselves represent a reliable basis for measurement.

In another embodiment, the accuracy of the wheel alignment test method is further improved by scanning the laser beam across an entire diameter of the wheel. In this way readings are obtained at corresponding radial locations on opposite sides of the wheel center, so as to obtain, if desired, more than one pair of distance readings from the sensor, whereby each pair of readings can be cross-checked against the other.

To obtain sufficient co-ordinates of the wheel to determine its exact planar attitude requires a minimum of three separate distance or displacement readings from the sensor, preferably (for simplicity) each of these being at a common radial spacing from the center of the wheel.

Where the laser scanning apparatus has been set up for scanning a diameter, the necessary data can readily be obtained by simply scanning two angularly separated diameters in sequence. For a more reliable result, three or more diameters will be scanned and the software can be readily provided with an algorithm for eliminating anomalies due to wheel rim damage. A laser having a slit and associated lens can readily scan the wheel in this manner.

In the described embodiment, the apparatus is mounted on fixed posts so that a vehicle can drive between them, thereby saving some of the setting up time. Means may be provided to enable the posts to be moved toward or away from the wheels to adjust the range of the laser displacement sensors (LDS's). The attitude of the LDS's at each side of the vehicle need to be such that they are parallel to each other, or at least lie in a plane having a known attitude.

In the case of wheel alignment testing in trucks, it is expected that the system will be mainly utilized for the front wheels of such trucks, although this could be readily extended to all wheels if the need arises.

The features of the invention are attained by providing apparatus for vehicle wheel alignment testing comprising a light source and sensor apparatus adapted to be positioned at a known location and known attitude, and means for locating a wheel to be tested with respect to the source and sensor apparatus so that displacement or range-finding steps can be carried out by the light source and sensor apparatus with respect to the wheel at spaced locations on the wheel to determine the attitude of the wheel. The light source and sensor apparatus includes means to effect the displacement or range-finding steps at plural locations on the wheel where significant displacement or range-affecting contour changes occur, the locations all being at known radial distances from the center of the wheel, whereby the attitude of the wheel can be determined.

Certain other features of the invention are attained by providing a method of vehicle wheel alignment testing utilizing the above-described apparatus.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

Embodiments of the invention will now be described by way of example with reference to the accompanying drawings in which.

DESCRIPTION OF THE PREFERRED EMBODIMENT

Figure 1:
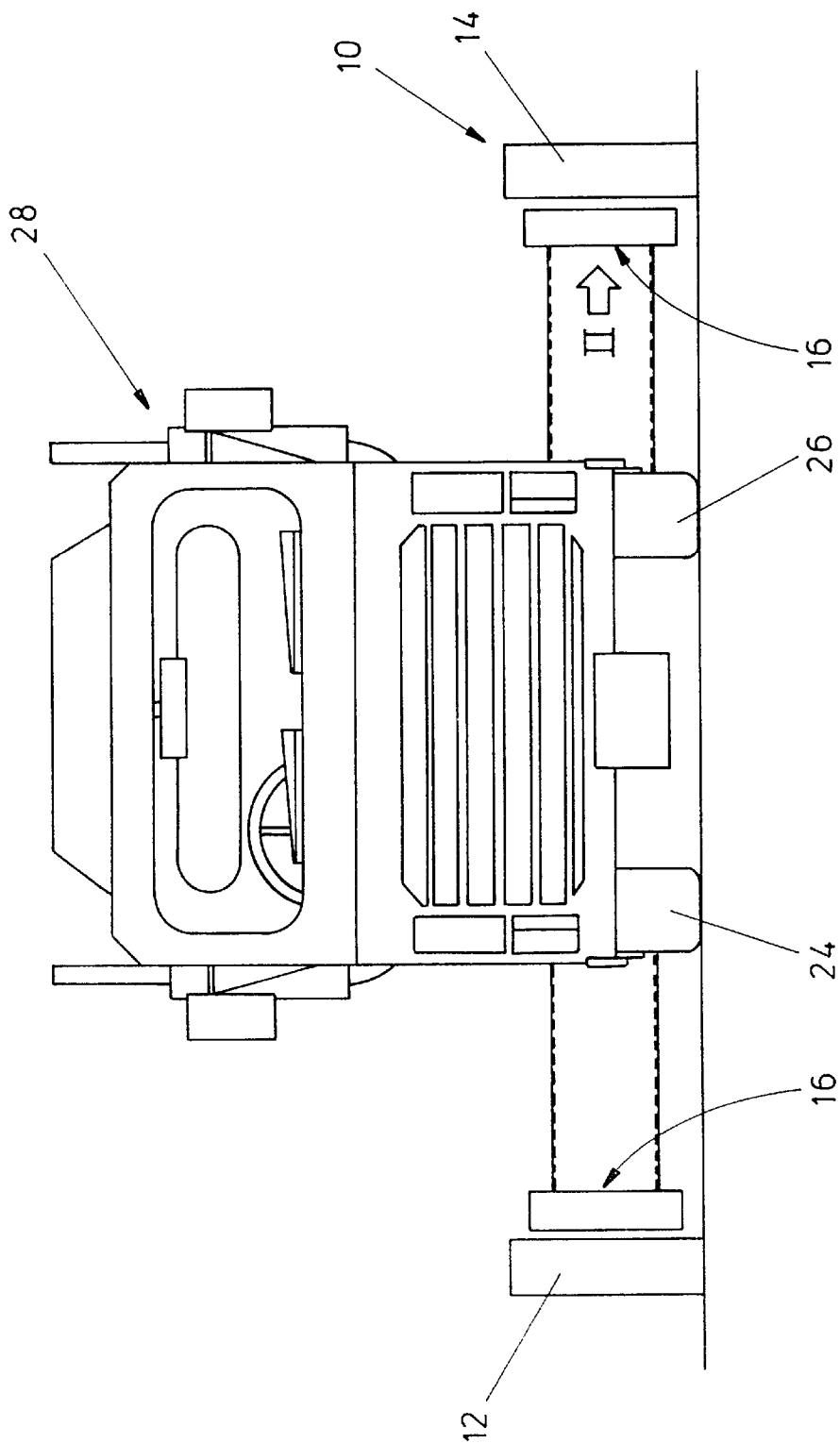
FIG. 1 shows a front elevation view of apparatus according to the invention shown in operation in relation to a truck.

As shown in FIG. 1, wheel alignment testing apparatus 10 comprises laterally aligned fixed posts 12, 14 each carrying an assembly 16 comprising laser displacement sensor heads 18, 20 and 22 (see FIG. 2), and adapted to carry out a displacement or range-finding operation in relation to the steerable front wheels, 24, 26 of truck 28, as will be more fully described below.

The laser assemblies 16 mounted on posts 12 and 14 are essentially identical in construction and only one of these will therefore be described.

Figure 2:
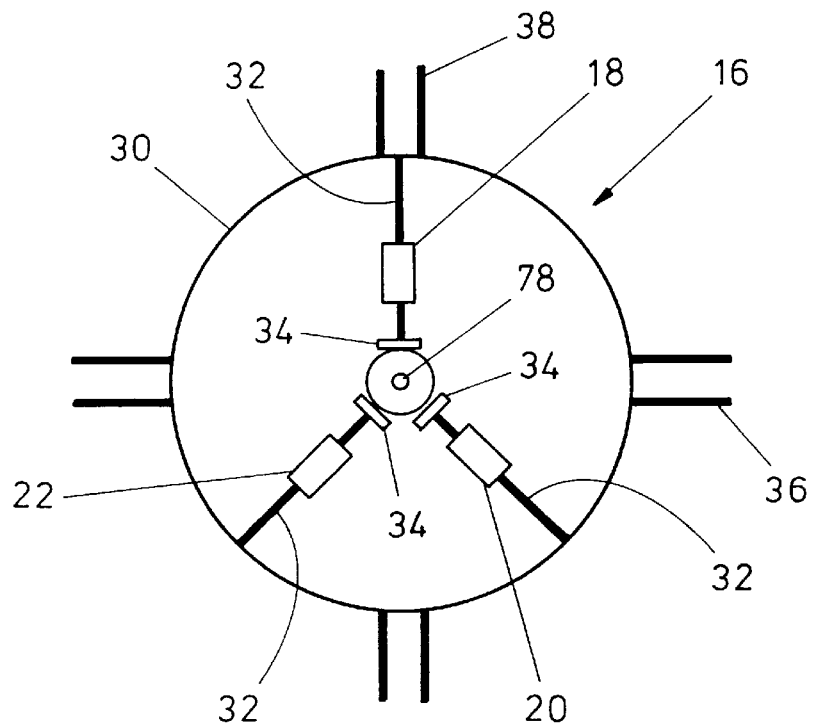
FIG. 2 shows a side elevation view of one item of laser sensor apparatus for transmitting range-finding laser beams at a vehicle wheel to be assessed, the direction of viewing being indicated by arrow II in FIG. 1.

As shown in FIG. 2, each laser assembly 16 comprises the three laser displacement sensor heads 18, 20 and 22 mounted on a common support 30 for generally radially (within ±15°) inward and outward scanning movement lengthwise of threaded rods 32 under the control of a stepper motor (not shown) and associated complementary threaded nuts 34, whereby the stepper motor can controllably cause the laser displacement sensor heads 18, 20 and 22 to be moved radially inwards and outwards in unison to scan one or more portions of the wheels 24 and 26.

Support 30 is adjustable vertically and horizontally, lengthwise of guides 36 and 38 in order to effect X- and Y-axis adjustment.

Figure 4:
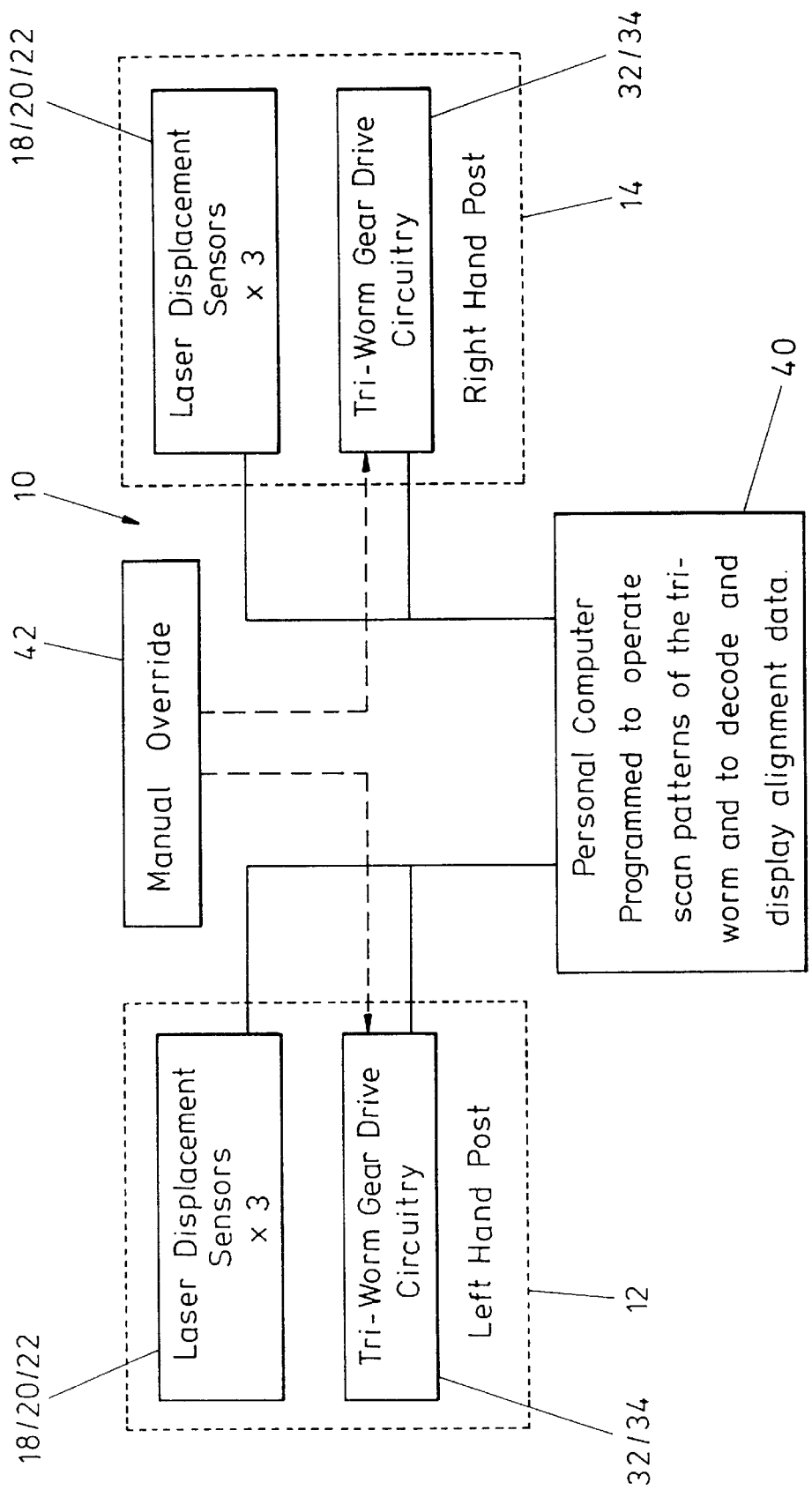
FIG. 4 shows in block diagram form the apparatus of the present invention in combination with a control system in the form of a personal computer.
Figure 5:
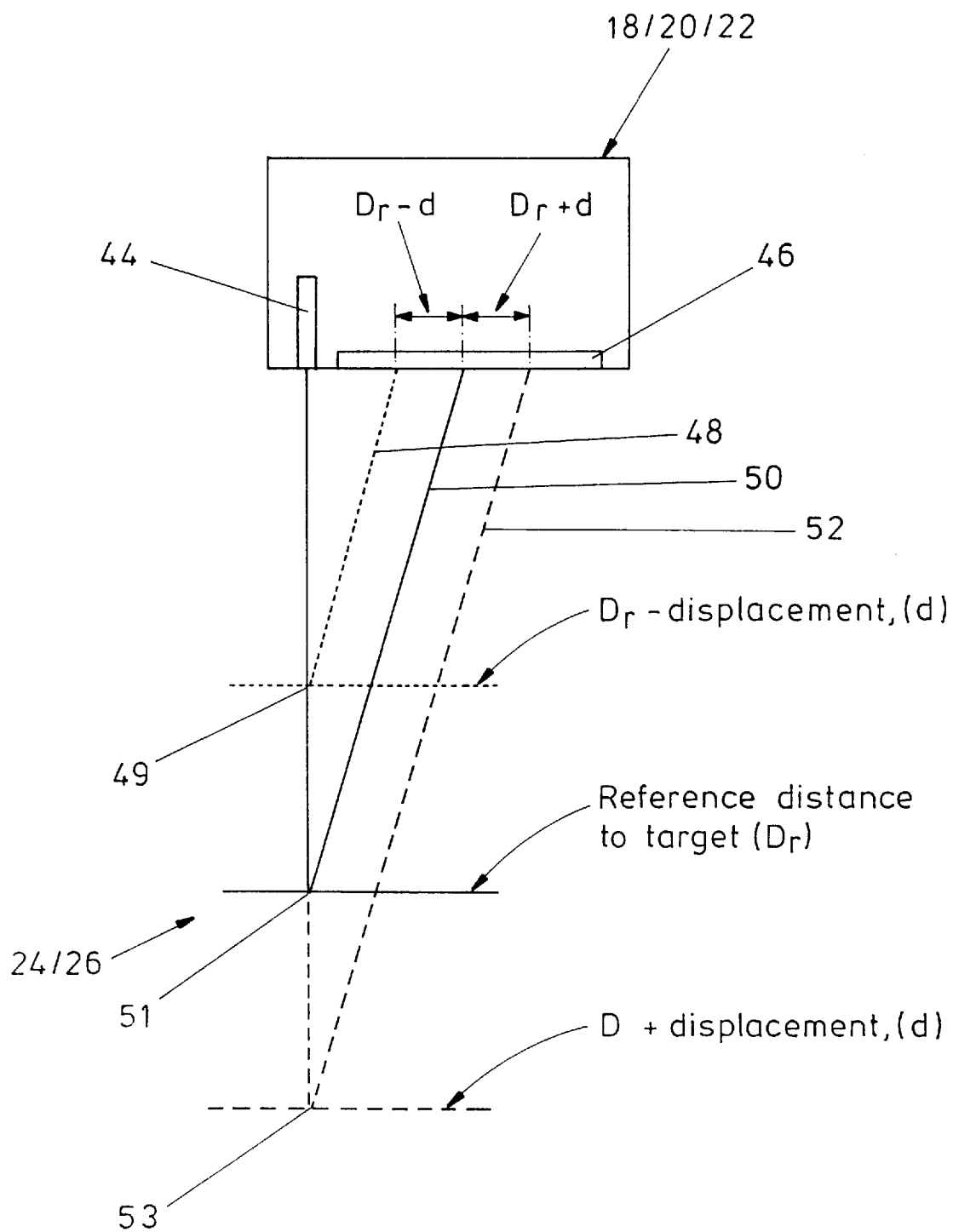
FIG. 5 shows in diagrammatic form the displacement effect produced in use by reflection of the laser beam from the wheel to be tested.

FIGS. 4 and 5 illustrate the general operational arrangement of the apparatus 10.

As shown in FIG. 4 the apparatus comprises a personal computer 40 controlling the laser displacement sensors 18, 20 and 22 together with the drives 32, 34 for effecting radial movement of these. A manual override 42 is provided for flexibility of operation when desired.

As shown in FIG. 5, the sensor heads 18, 20 and 22 each comprise a laser-generating emitter 44 and a sensor array 46 which provides a range-finding function by virtue of the illustrated system of triangulation, whereby the degree of displacement of the reflected beams 48, 50 and 52 provide a measure of the differences in range between points 49, 51, 53 on the wheels 24 and 26 at which reflection occurs.

Figure 3:
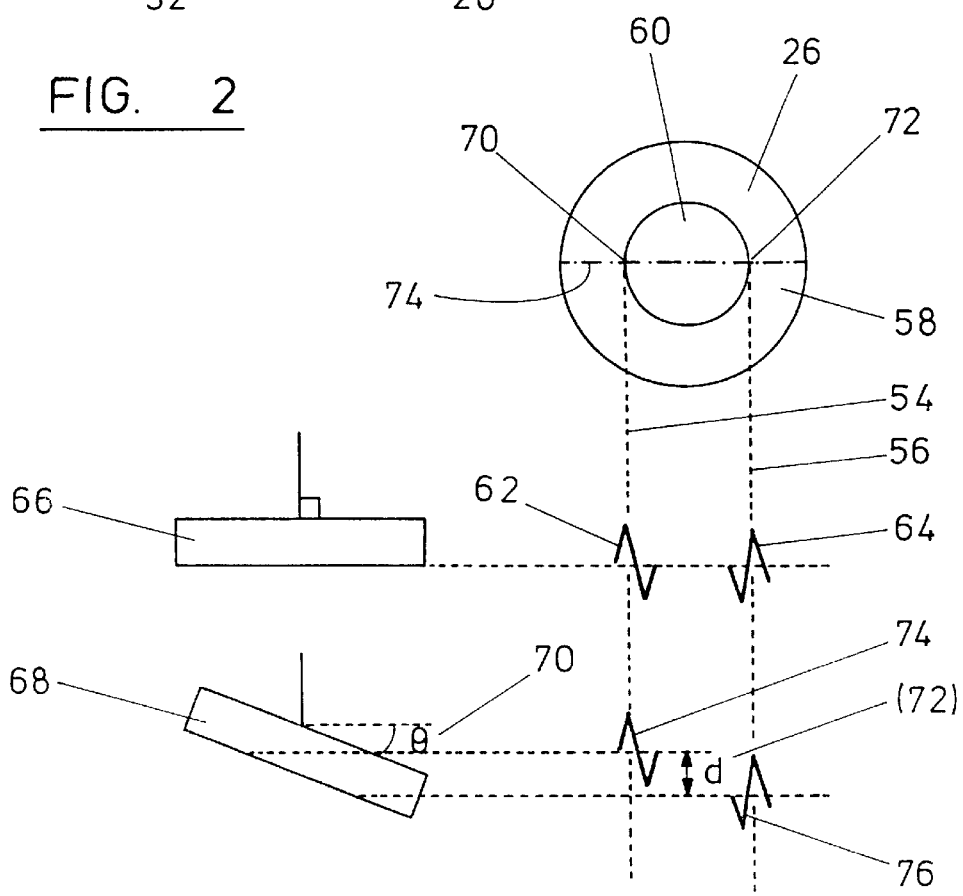
FIG. 3 shows a plan view indication of the manner in which the visual display unit trace produced by the apparatus can be interpreted in relation to a misaligned wheel.

Referring now to FIG. 3, there is shown, diagrammatically, one of the wheels 24, 26 with laser beams 54, 56 intersecting it at the location corresponding to the intersection between tire 58 and metallic wheel rim 60. At this location there is a substantial contour change due to the actual construction of the wheel and tire assembly whereby the metallic wheel rim overlaps the tire and retains it.

FIG. 3 shows a typical trace at 62 and 64 for a wheel (as shown at 66), which is disposed in a plane at right angles to the direction of the laser beams 54, 56.

There is also shown in FIG. 3 the corresponding displaced signals produced in the case of a misaligned wheel 68. In this case the angle of misalignment theta corresponds to the displacement d between the traces 74 and 76.

As shown in FIG. 3, the locations 70, 72 at which the scanning is effected may be at three equiangularly spaced locations as would be produced by the apparatus of FIG. 2 or may be effected at two locations 70, 72 on a common diameter 74, whereby the scanning operation can be simplified in terms of the apparatus which it requires. Alternatively, an extended laser beam could be used to obviate scanning.

The traces shown at 62, 64 and 74, 76 in FIG. 3 illustrate typical clear displacement signals obtained with the method of the invention at locations on the wheel and tire assembly where a significant contour change occurs, whereby the range-finding step of the method of the invention is greatly simplified.

This latter step is performed by personal computer 40 by reference to the known data relating to the positions of the laser displacement sensors 18, 20 and 22.

In this embodiment, the laser displacement sensor heads 18, 20 and 22 are physically scanned with respect to the wheel rim by the tri-worm drive devices 32, 34 after initial centering of the assembly by adjustment of support 30 with respect to the truck wheels 24, 26, using a single fixed light source 78 in the center of assemblies 16 to obtain an indication of the wheel center. The centering operation of the apparatus is carried out by use of the guides 36, 38 under the control of personal computer 40.

The signature produced by apparatus 10 is well-defined and repeatable due to the selected locations for the range determinations. These determinations could be made with the wheels rotating, but for most purposes this would be an unnecessary complication.

Figure 6:
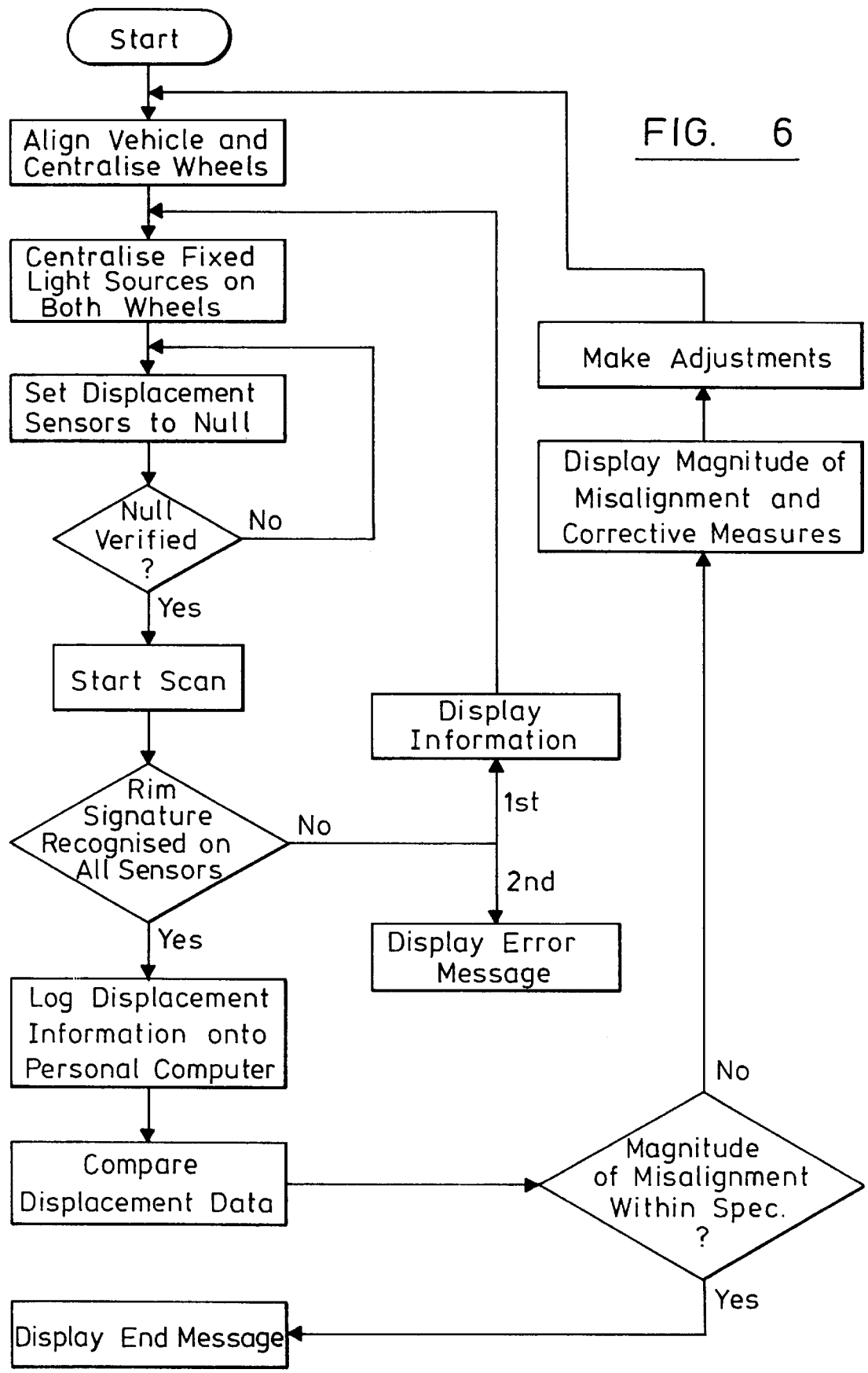
FIG. 6 is a flow diagram showing the procedural algorithm for the scanning system embodiment covering the optical and mechanical steps involved and their sequential and feedback relationships depending on yes/no results of particular steps.

FIG. 6 shows the procedural algorithm for this scanning system embodiment. In FIG. 6 there is indicated the optical and mechanical steps involved in the procedure and their sequential and feedback relationship which depend on yes/no results of particular steps.

In the method and apparatus of the invention, it is to be understood that the step of range or displacement determination of the relevant location on the wheel may be carried out purely by reference to the two or more other range or displacement-sensing steps. At its simplest, the invention may merely determine the displacement of one location on the wheel with respect to another, these quantities being determined by reference to the known position or attitude of the laser emitter and sensor assembly or assemblies. Accordingly, references in the text of this application to range-determination are to be understood as references also to displacement determination in terms of a comparison step with another location on the wheel. It is not, of course, essential actually to determine the range of a given location from the emitter/sensor assembly, but merely the axial displacement of one location from another.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. A method of vehicle wheel alignment testing comprising the steps of:

a) providing a light source and sensor apparatus at a known location and known attitude;

b) locating a wheel to be tested with respect to the source and sensor apparatus; and c) carrying out range-finding steps with respect to the wheel at spaced locations thereon to determine the attitude of the wheel;

said range-finding steps including range-finding at plural locations on the wheel where a significant abrupt range-affecting contour change occurs;

said locations all being at known radial distances from the center of the wheel, whereby the attitude of the wheel can be determined.

2. A method according to claim 1, wherein the light source is a laser.

3. A method according to claim 1, wherein plural light sources are provided respectively corresponding to the plural locations.

4. A method according to claim 1, wherein the number of said plural locations is three.

5. A method according to claim 1, wherein said radial distances of said locations from the center of the wheel are known for the purpose of determining the wheel alignment, only to the extent of each being equal.

6. A method according to claim 5, wherein said locations are all in the region of the wheel rim/tire intersection of said wheel.

7. A method according to claim 5 or claim 6, wherein two of said locations are on a common diameter.

8. A method according to claim 7, wherein a third location is located on a common diameter with a fourth such location where a further range-finding step is carried out, said four steps thus being carried out on two angularly spaced diameters.

9. A method according to claim 1, wherein said range-finding steps are carried out by scanning a laser spot across the relevant contoured portion of the wheel under test.

10. A method according to claim 9, wherein said laser spot is scanned in a generally radial direction, with respect to the wheel under test.

11. A method according to claim 1, wherein said range-finding steps are carried out by causing an extended laser beam to be applied to said locations.

12. A method according to claim 1, and further comprising the step of recognizing a characteristic of a signal derived from said locations where said significant contour changes occur.

13. Apparatus for vehicle wheel alignment testing comprising:
   a) a light source and sensor apparatus adapted to be positioned at a known location and known attitude; and
   b) means for locating a wheel to be tested with respect to said source and sensor apparatus so that range-finding steps can be carried out by said light source and sensor apparatus with respect to the wheel at spaced locations on the wheel to determine the attitude of the wheel;
   c) said light source and sensor apparatus including means to effect said range-finding steps at plural locations on the wheel where significant abrupt range-affecting contour changes occur, said locations all being at known radial distances from the center of the wheel, whereby the attitude of the wheel can be determined.

14. The apparatus of claim 13, wherein said light source and sensor apparatus includes a laser.

15. The apparatus of claim 13, wherein said light source and sensor apparatus includes plural light sources respectively corresponding to said plural locations.

16. The apparatus of claim 15, wherein said light source and sensor apparatus includes three light sources corresponding to three locations.

17. The apparatus of claim 13, and further comprising means to recognize a characteristic of a signal derived from said locations.

18. The apparatus of claim 17, wherein said means to recognize includes waveform recognition means.

\* \* \* \* \*